US006952817B1

(12) United States Patent
Harris et al.

(10) Patent No.: US 6,952,817 B1
(45) Date of Patent: Oct. 4, 2005

(54) GENERATING HARDWARE INTERFACES FOR DESIGNS SPECIFIED IN A HIGH LEVEL LANGUAGE

(75) Inventors: Jonathan C. Harris, Ellicott City, MD (US); Stephen G. Edwards, Woodbine, MD (US); James E. Jensen, Ellicott CIty, MD (US); Andreas B. Kollegger, Baltimore, MD (US); Ian D. Miller, Charlotte, NC (US); Christopher R. S. Schanck, Marriottsville, MD (US)

(73) Assignee: Xilinx, Inc., San Jose, CA (US)

( * ) Notice: Subject to any disclaimer, the term of this patent is extended or adjusted under 35 U.S.C. 154(b) by 91 days.

(21) Appl. No.: 10/310,336

(22) Filed: Dec. 4, 2002

(51) Int. Cl.[7] ................................................ G06F 17/50
(52) U.S. Cl. ............................. 716/18; 716/3; 717/140; 717/155; 717/156; 717/161
(58) Field of Search ................... 716/1, 3, 18; 717/140, 717/155, 156, 161

(56) References Cited

U.S. PATENT DOCUMENTS 6,625,797 B1 * 9/2003 Edwards et al. .............. 716/18
6,651,228 B1 * 11/2003 Narain et al. .................. 716/5

OTHER PUBLICATIONS

U.S. Appl. No. 10/310,260, filed Dec. 4, 2002, Edwards et al.

U.S. Appl. No. 10/310,362, filed Dec. 4, 2002, Edwards et al.

U.S. Appl. No. 10/310,520, filed Dec. 4, 2002, Miller et al.

* cited by examiner

*Primary Examiner*—Vuthe Siek
(74) *Attorney, Agent, or Firm*—Pablo Meles; John King

(57) ABSTRACT

A method of processing a general-purpose, high level language program to determine a hardware representation of the program can include compiling the general-purpose, high level language program to generate a language independent model (105, 110, and 115). The language independent model can be scheduled such that each component is activated when both control and valid data arrive at the component (120). An interface structure specifying a hardware interface through which devices external to the language independent model interact with a physical implementation of the language independent model can be defined and included in the language independent model (200, 300, 400).

28 Claims, 2 Drawing Sheets

GENERATING HARDWARE INTERFACES FOR DESIGNS SPECIFIED IN A HIGH LEVEL LANGUAGE

BACKGROUND OF THE INVENTION

1. Field of the Invention

The present invention relates to the field of hardware design and, more particularly, to generating a hardware description from a general-purpose, high level programming language.

2. Description of the Related Art

The design of field programmable gate arrays (FPGAS) or application specific integrated circuits (ASICs) typically begins with the development and validation of an algorithm which the integrated circuit (IC) is intended to implement. Presently, developers validate algorithmic designs by implementing algorithms in a high level programming language such as C, C++, Java, or the like. High level programming languages provide designers with the ability to rapidly prototype an algorithm, explore the algorithm in further detail, and ultimately prove or validate that the algorithm can sufficiently process the data for which the algorithm and the IC are being developed.

Once an algorithm has been validated, the designer can begin the process of transforming the high level language design into a hardware description implementation using VERILOG, VHDL, or some other hardware description language alternative. Presently, this transformation is performed manually by designers. As a result, the process can be very time intensive and error prone. Transformation of a high level language design to a hardware description language implementation involves tracking an extraordinary number of inter-relationships between timing signals and data. The designer must think in terms of clock cycles and relative timing between signals in the hardware description language. State machines must be designed that are capable of correctly moving data through the hardware description language code, and which are capable of enabling the correct subsystems at the proper times.

Attempts have been made to develop improved tools to aid in the transition from a high level language design to a hardware description language design. For example, specialized programming languages such as Handel-C and SystemC are enhanced programming languages that, when compiled, can produce a hardware description conforming to a particular hardware description language specification such as VERILOG or VHDL. Specialized programming languages such as these, however, are "hardware aware" in that the languages include significant enhancements in the way of standard libraries and extensions which allow programs written in these languages to be compiled into suitable hardware descriptions.

Handel-C, SystemC, and other "hardware aware" languages use a technique known as progressive elaboration. Under the technique of progressive elaboration, a designer codes a design in a high level language. After initial algorithmic verification, the designer successively adds more information and/or hardware aware constructs to the code to direct the compiler in terms of implementation. A final design is achieved by adding sufficient information to the source code to generate the desired results.

While "hardware aware" languages do help to ease the translation of validated algorithms to hardware description language designs, there are disadvantages to the use of specialized languages. One such disadvantage is the time required for developers to familiarize themselves with a different special purpose language. Although "hardware aware" languages typically are rooted in a known high level language such as the C programming language, developers still must learn special enhancements and additions to the language which make the generation of a hardware description language output possible.

Another disadvantage of specialized "hardware aware" languages can be the cost associated with purchasing the language as a design tool. The acquisition of a specialized language as a design tool adds yet another expense to the IC development process. Finally, "hardware aware" design tools which rely upon progressive elaboration design techniques require source code modifications to work properly.

Accordingly, a need exists in the electronics industry for an efficient way of capturing design functionality in a more abstract manner than is presently available with conventional hardware description languages.

SUMMARY OF THE INVENTION

The invention disclosed herein provides a method and apparatus for compiling a general-purpose, high level language program into a language independent model (LIM). The LIM can be analyzed, or compiled, and one or more interface structures can be determined. The interface structures enable components and/or devices which are external to the LIM to interact with the design. The interface structures can be determined, at least in part, with reference to the LIM itself, a user or system profile, as well as a library of interface structures. Accordingly, the determined interface structures can be incorporated into the LIM.

One aspect of the present invention can include a method of processing a general-purpose, high level language program to determine a hardware representation of the program. The method can include compiling the general-purpose, high level language program to generate a LIM. The LIM can be scheduled such that each component is activated when both control and valid data arrive at the component. An interface structure specifying a hardware interface through which devices external to the language independent model interact with a physical implementation of the language independent model can be defined. The interface structure can be included in the LIM.

According to one embodiment of the present invention, the defining step can include identifying locations in the program where processing begins, for example entry methods, which are represented in the LIM. A data input structure can be included in the LIM for each argument provided to one or more of the identified entry methods. A data output structure also can be included for each entry method which determines a result value from arguments input to the entry method.

The LIM can be analyzed to determine whether sequential components are specified. If so, structures for receiving a clock input signal and a reset input signal can be included. Additionally, whether or not structures for clock signals or reset signals are required, a structure can be included in the LIM for receiving an enabling signal which indicates that valid data exists at inputs to the LIM. Similarly, a structure can be included within the LIM for generating a data ready signal which indicates that valid data results are available at outputs of the LIM.

According to another embodiment of the present invention, a profile can be accessed. The profile can specify that the LIM is to be communicatively linked with an on-chip peripheral bus which is external to the LIM. An interface structure which communicatively links the LIM to the on-chip peripheral bus can be included within the LIM. Input arguments and result values can be mapped to memory locations addressable on the on-chip peripheral bus.

Another embodiment of the present invention can include identifying a data stream within the language independent model and associating the data stream with a first-in-first-out structure specifying a first-in-first-out memory. A first-in-first-out structure can be included in the LIM as well as an interface to the first-in-first-out structure. The interface to the first-in-first-out structure allows devices external to the LIM to read data from and write data to the first-in-first-out structure. Alternatively, a determination can be made, for example with reference to a user profile or system profile, that the first-in-first-out structure is not to be included in the LIM. Accordingly, an interface for reading data from and writing data to the first-in-first-out structure can be included in the LIM.

Another embodiment of the present invention can include identifying software memory constructs of the program which are represented in the LIM. The software memory constructs can be associated with memory structures specifying physical memory implementations. Accordingly, the memory structures representing the software memory constructs can be included in the LIM.

Notably, if the memory structures associated with the LIM exceed a predetermined memory size, a determination can be made that memory structures representing the software memory constructs are to be located external to the LIM. In that case, an interface can be included in the LIM for accessing the memory structures which are to be located external to the LIM. The interface can be defined by a preconfigured interface model. The preconfigured interface model can be user selected, and if so, the method can include accessing a profile to determine the user selected interface model.

BRIEF DESCRIPTION OF THE DRAWINGS

There are shown in the drawings embodiments which are presently preferred, it being understood, however, that the invention is not limited to the precise arrangements and instrumentalities shown.

DETAILED DESCRIPTION OF THE INVENTION

Figure 1:
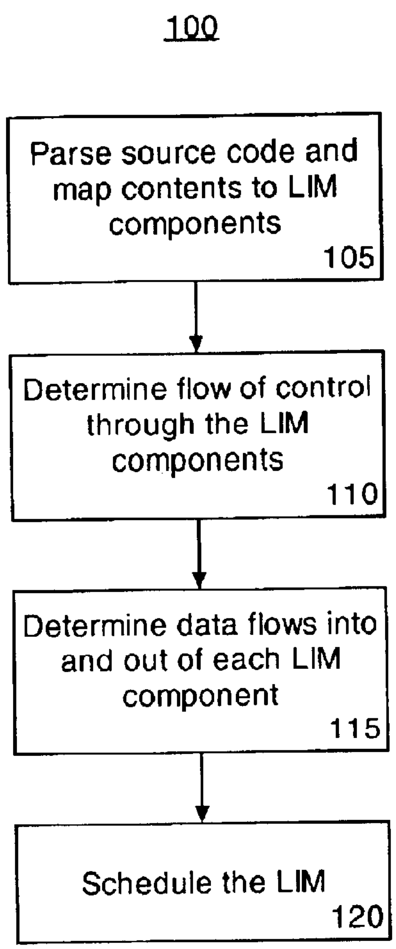
FIG. 1 is a flow chart illustrating a method of determining a language independent model for use with the present invention.

The invention disclosed herein provides a method and apparatus for generating interfaces for a hardware design specified in a general-purpose, high level programming language. In particular, a program written in a general-purpose, high level programming language can be compiled into a language independent model (LIM). The LIM can be analyzed, or compiled, and one or more interface structures can be determined. Accordingly, components and/or devices external to the LIM can communicate with the design specified by the LIM through the determined interfaces. The interface structures can be determined, at least in part, with reference to the LIM itself, a user or system profile, as well as a library of interface structures. Accordingly, the determined interface structures can be included into the LIM.

The present invention utilizes a LIM which is a programming language neutral and hardware neutral representation of a program and the program structure. Generally, the source code of a program can be mapped to the LIM automatically using a compiler configured as disclosed herein. From the LIM, a hardware description language specification can be derived automatically. The LIM is based upon the premise that many general-purpose, high level programming languages share a similar if not equivalent set of basic programming constructs for expressing logic. These basic programming constructs can include operations, whether arithmetic, logical, and/or bitwise, sequences, branches, loops, memory assignments and references, compound statements, and subroutine calls. Notably, in cases where more complex programming constructs exist, the complex programming constructs typically can be reduced to a set of equivalent primitive or less complex programming constructs. The LIM provides a hierarchical, abstract representation of these programming constructs.

The LIM is formed of a collection of components, wherein each component refers to a unit of functionality. The component can be a primitive, which refers to a low level "black box", or a module which refers to a container or collection of other components. Each component of the LIM can have one or more attributes which describe how that component relates to other components of the LIM. For example, component attributes can specify any external data values which the component requires in order to perform a function. The specified data values must be provided as inputs to the component by the components that produce the values. Component attributes also can specify any data values which the component produces for external consumption. The component can provide these data values as execution output, which in turn can be provided as input to other components of the LIM. Component attributes further can specify the order of execution of components in the LIM. Still, the examples disclosed herein are provided for purposes of illustration, and as such, are not intended to be an exhaustive listing of possible component attributes. In any case, the component attributes can be derived from a straightforward semantic analysis of program source code.

Notably, as a module is itself a component, components in the LIM can be hierarchically nested to an arbitrary depth. Different types of modules can exist which represent or correspond to different programming constructs. For example, common module types can include block modules, branch modules, and loop modules. A block module represents an ordered sequence of components. A branch module specifies the execution of one component or another based upon the value of a component which computes a conditional value. A loop module executes a body component iteratively until a conditional component produces a termination condition.

FIG. 1 is a flow chart illustrating a method 100 of deriving a LIM in accordance with the inventive arrangements disclosed herein. The method 100 can begin in step 105 by parsing the source code of a general-purpose, high level language program. The source code can be parsed into a hierarchy of LIM components. For example, the source code can be parsed with a grammar based parser, a step which typically is performed when compiling source code. The parser can produce a parse tree, which can be analyzed to determine the parse tree contents. Rather than generating assembly code, each syntactic construct can be mapped to one or more LIM components. For instance, an "if" statement can cause a branch component to be produced, which in turn may become a component in a higher level module. In this manner, the LIM description can be built from low to high level constructs.

In step 110, the flow of control through the various components of the LIM can be determined. Each module can specify the flow of control through its constituent components. That is, the logical order in which the various components of the LIM are to execute can be defined. Flow of control can be classified as software control flow or hardware control flow. For most modules, the two classifications are equivalent. For block modules, however, the meaning of software and hardware control flow diverge. Software control flow for a block module indicates that the constituent components within the block module execute one at a time in a sequential manner. Hardware control flow for a block module indicates that each component can begin execution in parallel. A block module can maintain both descriptions. A module can be said to have completed execution when all of the constituent components of the module have completed execution.

In step 115, the data flow into and out of each of the LIM components can be determined. By following the software flow of control through the LIM, the flow of data into and out of each component and module can be charted. Data flow can be represented by the annotation of data dependency information on each component. A data dependency indicates the source of a data value that is needed by a component before that component can begin execution. For each data value required by a component, a separate data dependency exists, and therefore, can be recorded for each different control flow path leading to the component. Using the type information obtained from the source code, each data flow also can be annotated with size information, a static initial value if one exists, and a type.

Data flows into and out of non-local storage, for example the heap rather than the stack, also can be recorded. This allows a picture of the global storage to be modeled. The global storage can be transformed into registers and memory banks in the hardware implementation. At this point, if desired, the design efficiency can be improved by replicating shared memory structures, replicating loop structures to eliminate potential data bottlenecks, and inlining memory accesses.

Once the LIM has been generated, in step 120, the LIM can be scheduled. For example, the LIM can be annotated to specify the physical connections between individual components and modules by a scheduling component of the compiler. The LIM is annotated with information specifying the actual wire connections as well as any additional hardware such as registers, arbitration logic, and/or interfaces which may be needed to preserve the semantics and syntax of the LIM as compared to the original source code, which will translate into an accurate hardware implementation of the source code.

The connections between each component of the LIM, or the annotated connection data of the components which specifies the physical connections, must satisfy the data dependencies and control constraints of the LIM. More particularly, each component can be activated when both of the following conditions are met: (1) the flow of control reaches the component, and (2) all of the data inputs to the component are available. As noted, in order to meet these requirements, additional structures which represent hardware components such as latches or registers for the data inputs, and flip-flops, "AND", or "OR" gates for the control signal may need to be inserted into the LIM. The scheduling process can proceed in a bottom-up fashion beginning with the lowest level components.

The scheduling process is run on a module by module basis such that the inputs of each module are assumed to be at time zero. Components within modules are scheduled only relative to other components in that module. Then, at the next hierarchical level up, that module is scheduled like any other component. Since the inputs of the module will be scheduled to guarantee validity, the scheduling criteria assumed when scheduling the components of that module will be true. If, due to a shared resource, a component in that module should execute after a component in another module, then those two modules can be scheduled to execute one after the other.

During the scheduling process, one or more optimization techniques can be applied to the LIM. For example, during the scheduling process, the LIM can be balanced and/or pipelined. Balancing refers to the addition of registers into the data and/or control paths in an effort to make each data and control path through the LIM require the same number of clock cycles from beginning to end. Pipelining refers to the inclusion of registers into the data paths of the LIM to reduce the length of combinational logic paths and increase the effective frequency of the resulting design. Balancing and pipelining, in combination, can allow a design to process a new set of inputs each clock cycle. More particularly, balancing improves the rate at which data can be fed into the design up to the ideal maximum of one data set every clock cycle. Implicit feedback, loops, shared resources, and the like can effectively increase the number of cycles between data sets. Pipelining improves the operational frequency of the design. In conjunction, balancing and pipelining serve to increase the data throughput rate of the circuit.

In order to be useful, the hardware specified by the LIM should include interfaces that allow the hardware implementation of the LIM to interact with an external environment of one or more devices. Interface structures can be added to the LIM using several different techniques. The various LIM structures discussed with reference to FIGS. 2–4 which can be included within the LIM can be defined or modeled in a library of hardware interfaces for use with the present invention. For example, a compiler having access to the library can insert selected structures from the library into the LIM. The selection of particular interface structures, as well as any modification of the structures, can be performed in accordance with determinations made from an analysis of the program as represented by the LIM, as well as one or more other parameters as specified within a user or system profile. For example, the interface models can be specified using an appropriate hardware description language, with a netlist, or using a format which complies with the syntax of the LIM.

Figure 2:
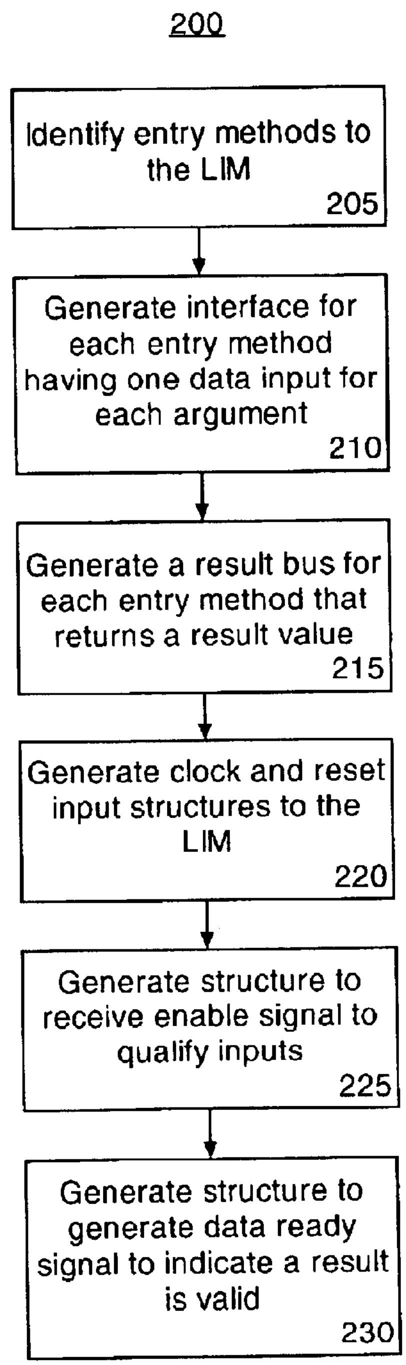
FIG. 2 is a flow chart illustrating a method of generating interfaces for entry methods represented in the language independent model in accordance with the present invention.

FIG. 2 is a flow chart illustrating a method 200 of generating interfaces for entry methods of a general-purpose, high level language program represented by the LIM in accordance with the present invention. More particularly, the method 200 illustrates a method in which an interface for the hardware implementation of the LIM can be inferred from the entry methods of the program. Beginning in step 205, the entry methods within the LIM can be identified. Within a given a top-level source code specification for a design, particular methods or functions are identified as entry methods. Entry methods are the points within a program design where processing begins. For example, in the JAVA programming language, entry methods can include all methods in the top class identified as "public".

Alternatively, entry methods can be specified via an application programming interface (API). Still, entry methods can be specified by name via a command line input to a compiler or within a profile or other data file which can be passed into a compiler configured in accordance with the present invention. Each of the entry methods takes 0 or more arguments and can produce a result value.

An interface can be generated for each entry method. In step 210, a data input can be generated for each argument that is provided as an input to an entry method. For example, one or more structures specifying input pins or ports can be added to the LIM, wherein each structure can receive an input value from an external source. In step 215, one result bus can be generated for each entry method that returns a result value. More particularly, one or more structures specifying output ports or pins can be added to the LIM, wherein each structure provides a result to an external data sink.

In step 220, structures which specify input ports or pins for receiving a clock signal and a reset signal for the entry methods can be included in the LIM. Clock and reset signal input structures can be included automatically in cases wherein entry methods incorporate sequential clocked elements or components. In step 225, a structure representing a hardware input for receiving an enable or "GO" signal can be generated and inserted into the LIM for each entry method that requires such a signal. The enable signal is provided by devices external to the LIM and signifies that data at the input ports of the entry method is qualified or valid. Notably, each "GO" signal can be enabled independently of the others, or alternatively, the "GO" signals can be linked to start each entry method simultaneously.

In step 230, a structure representing a hardware output for generating a data ready or "DONE" signal can be generated and inserted into the LIM. The data ready signal is generated by the hardware implementation of the LIM to indicate that results output from a hardware implementation of an entry method are valid. For example, if the entry method does not have fixed timing or has a latency of more than 0 clock cycles, structures for receiving an enable signal and generating a data ready signal can be inserted. It should be appreciated that one enable/data ready pair can be generated for each entry method. Notably, structures for generating a GO/DONE signal need not be included in the LIM if the generated circuit is either combinational or a fixed latency. Still, if the user desires, the structures can be forced onto a design.

Another type of interface that can be generated for interacting with the hardware implementation of the LIM is an interface structure which allows the hardware implementation to be connected with other peripheral devices. The other peripheral devices, although located on the same integrated circuit as the LIM specified design, are not specified by the LIM itself. Rather, the LIM communicates with the other peripheral devices via an "On-Chip-Peripheral-Bus", referred to as an OPB interface.

The OPB interface, as specified by "On-Chip Peripheral Bus Architecture Specifications 2.1", International Business Machines Corporation, (2001), is a fully synchronous bus that functions independently at a separate level of bus hierarchy. The OPB interface is not intended to connect directly to a processor core. The OPB interface provides separate 32-bit address and up to 32-bit data buses. Since the OPB supports multiple master devices, the address bus and data bus are implemented as a distributed multiplexer.

Additional logic structures can be automatically generated and inserted into the LIM to communicatively link the LIM with an OPB interface. Memory mapping is used to provide specific addresses for each argument being input to an entry method and for each result generated by an entry method. Control logic also can be generated to enable the entry method and query the result/done functions of the OPB interface. Additional files can be generated as needed for backend tools to specify the interface and memory map.

For example, if an option is selected, the LIM can be compiled and annotated to specify an interface structure within the LIM for communicating with an OPB interface external to the LIM. Inputs and outputs of the LIM can be supplied to the interface which is configured specifically to interact with the OPB interface. Accordingly, the resulting annotated LIM can specify a hardware implementation as an OPB core which is suitable for integration into an OPB system.

Figure 3:
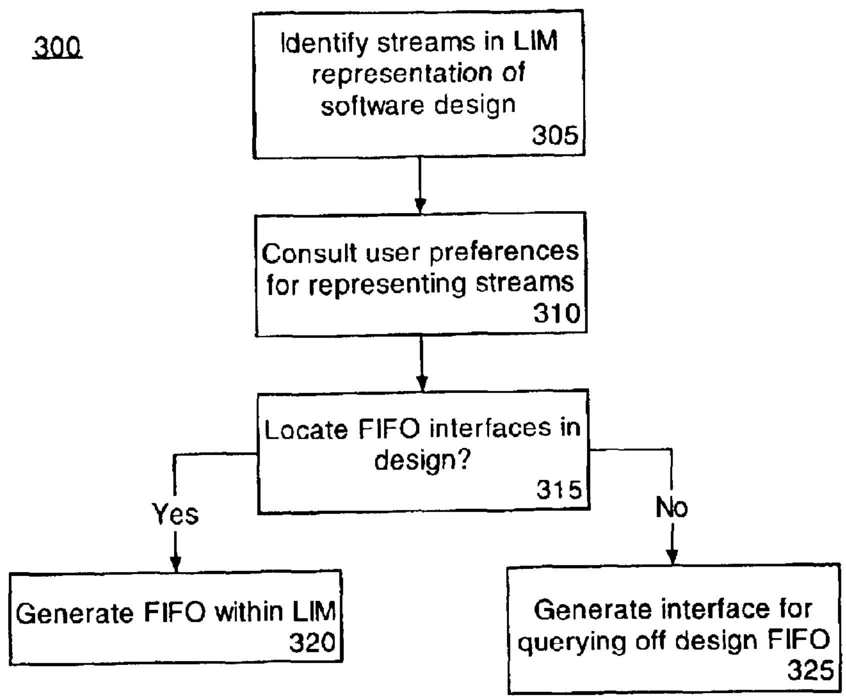
FIG. 3 is a flow chart illustrating a method of specifying high level interfaces from high level software constructs specified in the language independent model.

FIG. 3 is a flow chart illustrating a method 300 of specifying high level interfaces from high level software constructs specified in the LIM. The use of high level constructs such as streams which are available in most object-oriented languages can indicate the generation of a specific type of interface to the LIM. Data streams identified within a software design can be modeled as first-in-first-out (FIFO) memories which serve as an interface to the entry method. As a data stream is a continuous sequence of data elements, the FIFO memory is a natural corollary to the software construct. Accordingly, in step 305, streams in the LIM representation of the software design can be identified.

In step 310, the compiler can access a user profile or a system profile in which preferences for representing data streams can be specified. The profile can specify whether a structure representing a FIFO memory for a data stream is to be generated and included as part of the LIM, or alternatively, that the FIFO memory will be located off-chip, and thus only a structure specifying an interface for querying a FIFO memory is needed within the LIM. Accordingly, in step 315, a determination can be made as to whether FIFO memories are to be included within the LIM.

If so, the method can proceed to step 320, where one or more structures specifying FIFO memories can be included within the LIM. If structures specifying FIFO memories are included within the LIM, the FIFO memory structure also can specify an interface to the FIFO memory structure within the LIM. The interface to the FIFO memory can be presented to logic and/or devices external to the LIM. An on-chip implementation of a FIFO memory indicates that the interface structure to the FIFO memory within the LIM must receive data signals as well as a write enable signal from external devices. For example, structures can be inserted to the LIM for receiving data into the FIFO memory as well as for receiving a data write signal from logic and/or devices external to hardware represented by the LIM.

If the FIFO memories are not to be included within the LIM, that is the FIFO memories are to be located off-chip, the method can proceed to step 325. In step 325, one or more structures specifying interfaces to an off-chip FIFO memory can be inserted into the LIM. The structures representing interfaces can be configured to query the off-chip FIFO memory for data. An off-chip implementation of a FIFO memory indicates that the interface structure inserted into the LIM must be configured to check an input signal indicating when data is available in the FIFO memory, and responsive to receiving such an input signal, read the FIFO memory. For example, appropriate structures can be inserted into the LIM for sampling an "empty flag" of the off-chip FIFO memory. When data is available, the data can be read from the FIFO memory and processed. The data stream concept can be applied to both inputs and outputs. In the case of an output data stream, the design can write data into the FIFO memory whether the FIFO is implemented internal or external to the design.

Figure 4:
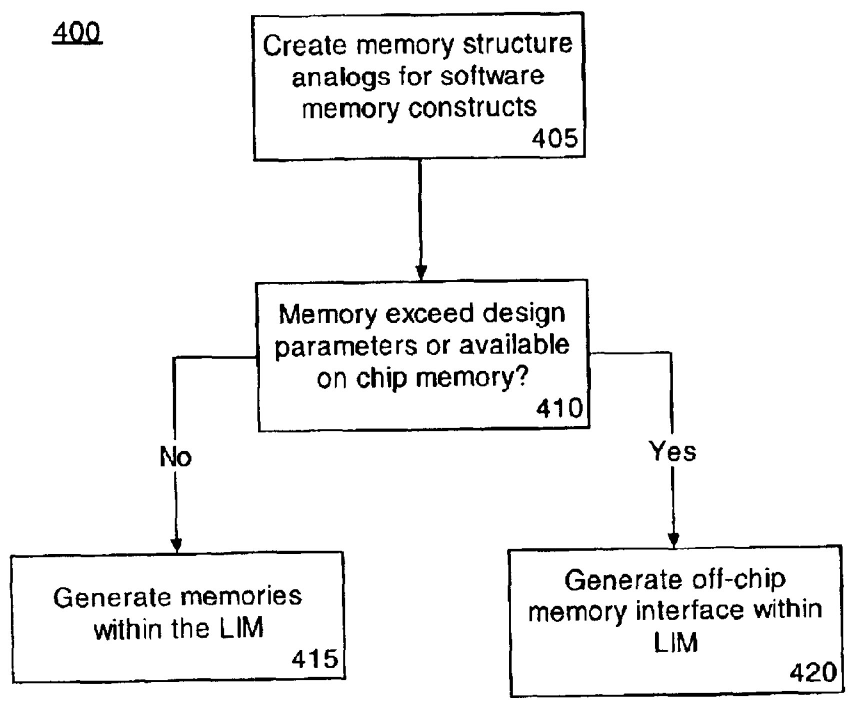
FIG. 4 is a flow chart illustrating a method of creating memory structure representations of software memory constructs in accordance with the present invention.

FIG. 4 is a flow chart illustrating a method 400 of creating memory structure representations of software memory constructs in accordance with the present invention. Software memory constructs defined in the source code can be represented in the LIM as memory structures. For example, fields can be translated into registers and arrays or large data sets can be translated into random access memory or read-only memory depending upon the read and write access to the array and/or fields. Thus, in step 405, memory structure analogs of software memory constructs can be created.

In step 410, the total size of the memory structures generated in step 405 can be compared with parameters of a user or system profile which specify either the total available on-chip memory or the amount of memory that has been allocated to the design by a user. If the size of the memory structures exceeds the specified maximum memory, the method can proceed to step 415. In step 415, the structures representing the memories can be inserted into the LIM. If the size of the memory structures exceeds the specified maximum, the method can proceed to step 420. In step 420, interfaces for accessing off-chip memories can be generated for those memory structures that will be located off-chip, or for those memory structures which will not be specified by the LIM.

It should be appreciated that the type of interfaces generated can be specified by the user, for example within the user or system profile. For example, an interface or interface type can be specified as a reference to a model specified using a hardware description language such as VERILOG or VHDL. The interface further can be specified as a netlist or in a format that is compliant with the syntax of the annotated LIM. Regardless, the models can be stored within an interface library as previously noted.

An API also can be provided which allows a user to specify specific pins, ports, and/or other input and output structures for the design. This API can be used to specify specific behavior of the pins and specific timing relationships between the pins. Moreover, the API provides a user with a library of LIM structures for specifying an interface through which the design can interact with a soft Intellectual Property (IP) core to be included within, and interacted with by the design. Accordingly, the API allows a user to write and specify any of a variety of specific interfaces in an abstract manner. Due to the necessity of conforming to exact timing which is enforced by external devices, the ability to define specific clock cycle boundaries and pin behavior is provided via the API and strictly followed by the scheduler in the compiler.

The resulting LIM can be translated into a target hardware description language. As the LIM is effectively a hierarchical netlist at this point in the process, the transformation of the LIM to a target hardware description language is readily performed.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of processing a general-purpose, high level language program to determine a hardware representation of the program, said method comprising:

compiling the general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises identifying locations where processing begins in entry methods of the general-purpose, high-level language program represented in the language independent model; including a data input structure for each argument provided to an identified entry method; and including a data output structure for each entry method which determines a result value from arguments input to the entry method; and generating the interface structure in the language independent model during the compiling step.

2. The method of claim 1, said defining step further comprising:

determining that the language independent model specifies sequential components; and said generating the interface structure step further comprising including structures for receiving a clock input signal and a reset input signal.

3. The method of claim 2, said generating the interface structure step further comprising:

inserting a structure for receiving an enabling signal indicating that valid data exists at inputs to the language independent model; and inserting a structure for generating a data ready signal indicating that valid data results are available at outputs of the language independent model.

4. The method of claim 1, said generating the interface structure step further comprising:

inserting a structure for receiving an enabling signal indicating that valid data exists at inputs to the language independent model; and inserting a structure for generating a data ready signal indicating that valid data results are available at outputs of the language independent model.

5. A method of processing a general-purpose, high level language program to determine a hardware representation of the program, said method comprising:

compiling the general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises accessing a profile specifying that the language independent model is to be communicatively linked with an on-chip peripheral bus located external to the language independent model; and generating the interface structure in the language independent model during the compiling step.

6. The method of claim 5, said generating the interface structure step further comprising:

inserting an interface structure which communicatively links the language independent model to the on-chip peripheral bus.

7. The method of claim 6, said step of inserting an interface structure further comprising:

mapping input arguments and result values to memory locations addressable on the on-chip peripheral bus.

8. A method of processing a general-purpose, high level language program to determine a hardware representation of the program, said method comprising:

compiling the general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises identifying a data stream software construct within the language independent model; and associating the data stream software construct with a first-in-first-out structure specifying a first-in-first-out memory; and generating the interface structure in the language independent model during the compiling step.

9. The method of claim 8, said generating the interface structure step further comprising:

including a first-in-first-out structure; and including an interface to the first-in-first-out structure through which devices external to the language independent model read data from and write data to the first-in-first-out structure.

10. The method of claim 8, said defining step further comprising:

determining that the first-in-first-out structure is not to be included in the language independent model; and said generating the interface structure step further comprising including an interface for reading data from and writing data to the first-in-first-out structure.

11. A method of processing a general-purpose, high level language program to determine a hardware representation of the program, said method comprising:

compiling the general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises identifying software memory constructs of the program represented by the language independent model; associating the software memory constructs with memory structures specifying physical memory implementations; and generating the interface structure in the language independent model during the compiling step, including the memory structures representing the software memory constructs.

12. A method of processing a general-purpose, high level language program to determine a hardware representation of the program, said method comprising:

compiling the general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises identifying software memory constructs of the program represented by the language independent model; associating the software memory constructs with memory structures specifying physical memory implementations; and if the associated memory structures exceed a predetermined memory size, determining that memory structures representing the software memory constructs are to be located external to the language independent model; and generating the interface structure in the language independent model during the compiling step.

13. The method of claim 12, said generating the interface structure step further comprising:

including within the language independent model an interface for accessing the memory structures located external to the language independent model, wherein the interface is defined by a preconfigured interface model.

14. The method of claim 13, wherein the preconfigured interface model is user selected, said defining step further comprising:

accessing a profile to determine the user selected interface model.

15. A machine-readable storage, having stored thereon a computer program having a plurality of code sections executable by a machine for causing the machine to perform the steps of:

compiling a general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface comprises identifying locations where processing begins in entry methods of the general-purpose, high-level language program represented in the language independent model; including a data input structure for each argument provided to an identified entry method; and including a data output structure for each entry method which determines a result value from arguments input to the entry method; and generating the interface structure in the language independent model when compiling the general-purpose, high level language program.

16. The machine-readable storage of claim 15, said defining step further comprising:

determining that the language independent model specifies sequential components; and said generating the interface structure step further comprising including structures for receiving a clock input signal and a reset input signal.

17. The machine-readable storage of claim 16, said generating the interface structure step further comprising:

inserting a structure for receiving an enabling signal indicating that valid data exists at inputs to the language independent model; and inserting a structure for generating a data ready signal indicating that valid data results are available at outputs of the language independent model.

18. The machine-readable storage of claim 15, said generating the interface structure step further comprising:

inserting a structure for receiving an enabling signal indicating that valid data exists at inputs to the language independent model; and inserting a structure for generating a data ready signal indicating that valid data results are available at outputs of the language independent model.

19. A machine-readable storage, having stored thereon a computer program having a plurality of code sections executable by a machine for causing the machine to perform the steps of:

compiling a general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises accessing a profile specifying that the language independent model is to be communicatively linked with an on-chip peripheral bus located external to the language independent mode;

generating the interface structure in the language independent model when compiling the general-purpose, high level language program.

20. The machine-readable storage of claim 19, said generating the interface structure step further comprising:

inserting an interface structure which communicatively links the language independent model to the on-chip peripheral bus.

21. The machine-readable storage of claim 20, said step of inserting an interface structure further comprising:

mapping input arguments and result values to memory locations addressable on the on-chip peripheral bus.

22. A machine-readable storage, having stored thereon a computer program having a plurality of code sections executable by a machine for causing the machine to perform the steps of:

compiling a general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises identifying a data stream software construct within the language independent model; and associating the data stream software construct with a first-in-first-out structure specifying a first-in-first-out memory; and generating the interface structure in the language independent model when compiling the general-purpose, high level language program.

23. The machine-readable storage of claim 22, said generating the interface structure step further comprising:

including a first-in-first-out structure; and including an interface to the first-in-first-out structure through which devices external to the language independent model read data from and write data to the first-in-first-out structure.

24. The machine-readable storage of claim 22, said defining step further comprising:

determining that the first-in-first-out structure is not to be included in the language independent model; and said generating the interface structure step further comprising including an interface for reading data from and writing data to the first-in-first-out structure.

25. A machine-readable storage, having stored thereon a computer program having a plurality of code sections executable by a machine for causing the machine to perform the steps of:

compiling a general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises identifying software memory constructs of the program represented by the language independent model; associating the software memory constructs with memory structures specifying physical memory implementations; and generating the interface structure in the language independent model when compiling the general-purpose, high level language program, including the memory structures representing the software memory constructs.

26. A machine-readable storage, having stored thereon a computer program having a plurality of code sections executable by a machine for causing the machine to perform the steps of:

compiling a general-purpose, high level language program to generate a language independent model;

scheduling the language independent model such that each component of the language independent model is activated when both control data and valid data inputs arrive at the component;

defining an interface structure specifying a hardware interface through which devices external to the language independent model interact with a physical implementation of the language independent model, wherein defining an interface structure comprises identifying software memory constructs of the program represented by the language independent model; associating the software memory constructs with memory structures specifying physical memory implementations; and if the associated memory structures exceed a predetermined memory size, determining that memory structures representing the software memory constructs are to be located external to the language independent model; and generating the interface structure in the language independent model when compiling the general-purpose, high level language program.

27. The machine-readable storage of claim 26, said generating the interface structure step further comprising:

including within the language independent model an interface for accessing the memory structures located external to the language independent model, wherein the interface is defined by a preconfigured interface model.

28. The machine-readable storage of claim 27, wherein the preconfigured interface model is user selected, said defining step further comprising:

accessing a profile to determine the user selected interface model.

* * * * *